United States Patent
Anzou et al.

(10) Patent No.: US 7,783,942 B2
(45) Date of Patent: Aug. 24, 2010

(54) INTEGRATED CIRCUIT DEVICE WITH BUILT-IN SELF TEST (BIST) CIRCUIT

(75) Inventors: Kenichi Anzou, Kawasaki (JP); Chikako Tokunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 268 days.

(21) Appl. No.: 11/936,212

(22) Filed: Nov. 7, 2007

(65) Prior Publication Data
US 2008/0112241 A1    May 15, 2008

(30) Foreign Application Priority Data
Nov. 10, 2006   (JP) .............................. 2006-305796

(51) Int. Cl.
*G11C 29/00* (2006.01)
*G01R 31/28* (2006.01)

(52) U.S. Cl. ........................... 714/718; 714/733
(58) Field of Classification Search .................. 714/718, 714/733
See application file for complete search history.

(56) References Cited

U.S. PATENT DOCUMENTS

| | | | |
|---|---|---|---|
| 6,563,751 B1 * | 5/2003 | Wu ............................ | 365/201 |
| 6,671,842 B1 | 12/2003 | Phan et al. | |
| 6,675,336 B1 | 1/2004 | Thakur et al. | |
| 6,681,358 B1 * | 1/2004 | Karimi et al. ............... | 714/733 |
| 6,834,361 B2 * | 12/2004 | Abbott ......................... | 714/42 |
| 6,865,701 B1 * | 3/2005 | Youngs et al. ............... | 714/718 |
| 6,988,251 B2 * | 1/2006 | Vogel ............................ | 716/2 |
| 7,065,686 B2 | 6/2006 | Endo et al. | |
| 7,183,798 B1 * | 2/2007 | He et al. ........................ | 326/38 |
| 7,194,670 B2 * | 3/2007 | Fales et al. ................... | 714/733 |
| 7,206,984 B2 | 4/2007 | Anzou | |
| 7,506,225 B2 * | 3/2009 | Gerowitz et al. ............. | 714/718 |
| 2003/0140289 A1 * | 7/2003 | Endo et al. .................... | 714/718 |
| 2007/0011535 A1 | 1/2007 | Anzou et al. | |
| 2008/0028267 A1 * | 1/2008 | Hayashi et al. .............. | 714/733 |

FOREIGN PATENT DOCUMENTS

JP          2003-217299          7/2003

* cited by examiner

*Primary Examiner*—James C Kerveros
(74) *Attorney, Agent, or Firm*—Turocy & Watson, LLP

(57) ABSTRACT

An integrated circuit device according to an embodiment of this invention includes: a memory having: a first port to which a first clock signal is input, and a second port to which a second clock signal is input; and a built-in self test circuit having: a first signal generating circuit to which the first clock signal is input, a second signal generating circuit to which the second clock signal is input, a clock selecting circuit to which the first and second clock signals are input and which selects and outputs one of the input clock signals, and a controlling circuit which outputs a clock requesting signal requesting one of the first and second clock signals to the clock selecting circuit, operates in accordance with the clock signal selected and output by the clock selecting circuit, and outputs a controlling signal for controlling one of the first and second signal generating circuits.

20 Claims, 6 Drawing Sheets

INTEGRATED CIRCUIT DEVICE WITH BUILT-IN SELF TEST (BIST) CIRCUIT

CROSS REFERENCE TO RELATED APPLICATION

This application is based upon and claims the benefit of priority from the prior Japanese Patent Application No. 2006-305796, filed on Nov. 10, 2006, the entire contents of which are incorporated herein by reference.

BACKGROUND OF THE INVENTION

1. Field of the Invention

The present invention relates to an integrated circuit device, for example, a semiconductor integrated circuit including a built-in self test circuit.

2. Background Art

There is widely used a method such as building a built-in self test circuit (hereinafter referred to as a "BIST circuit") into a semiconductor integrated circuit having an embedded memory, and detecting a failure in the memory using the BIST circuit, in a manufacturing test on the semiconductor integrated circuit. Specific examples of a failure detection method include a "comparator-type BIST" in which read data is compared with written data after each reading, and the presence or absence of a failure is determined based on a comparison result, and a "compactor-type BIST" in which reading results are collectively compacted, and the presence or absence of a failure is determined based on a compaction result.

An operation clock of the BIST circuit needs to be synchronized with an operation clock of the memory. In particular, when high-speed test operation is performed, it is necessary to cause the clock of the BIST circuit and the clock of the memory to have the same source, and to perform adjustment processing such as clock tree synthesis to minimize clock skew.

In a multi-port memory having a plurality of ports, each port generally includes its own clock input which is supplied with a clock. In some cases, these ports are supplied with clocks with frequencies independent of each other. In such cases, if no measures are taken, it is impossible to synchronize an operation clock of a BIST circuit with clocks of all these ports, and it is impossible to proceed with a test correctly. In order to synchronize the operation clock of the BIST circuit with the clocks of the ports, the clock input of each port may be provided with a switching circuit so that, in a test, the ports are supplied with the clocks having the same source. However, the speed of the operation clock of the multi-port memory is often high, and insertion of such a switching circuit largely affects the performance of the multi-port memory. Insertion of such a switching circuit is also disadvantageous in that it disables a test at a clock frequency of a system clock.

JP-A 2003-217299 (KOKAI) discloses a circuit configuration which performs a test using a BIST circuit without a switching circuit. In JP-A 2003-217299 (KOKAI), after writing into all addresses of a memory is performed in response to a first clock, reading from all the addresses of the memory is performed in response to a second clock. However, this is the simplest among algorithms for a test using a BIST circuit, and a more complicated algorithm is generally used, such as a "March test" in which writing and reading are alternately performed for each address. In a test based on such a complicated algorithm, port switching is frequently performed during operation, therefore the circuit configuration in JP-A 2003-217299(KOKAI) cannot perform such a test.

SUMMARY OF THE INVENTION

An embodiment of the present invention is, for example, an integrated circuit device including: a memory having: a first port to which a first clock signal is input, and a second port to which a second clock signal is input; and a built-in self test circuit having: a first signal generating circuit to which the first clock signal is input and which operates in accordance with the first clock signal and generates and outputs a signal for testing the memory, a second signal generating circuit to which the second clock signal is input and which operates in accordance with the second clock signal and generates and outputs a signal for testing the memory, a clock selecting circuit to which the first and second clock signals are input and which selects and outputs one of the input clock signals, and a controlling circuit which outputs a clock requesting signal requesting one of the first and second clock signals to the clock selecting circuit, operates in accordance with the clock signal selected and output by the clock selecting circuit, and outputs a controlling signal for controlling one of the first and second signal generating circuits.

Another embodiment of the present invention is, for example, an integrated circuit device including: a first memory having: a first port to which a first clock signal is input, and a second port to which a second clock signal is input; a second memory having: a third port to which a third clock signal is input, and a fourth port to which a fourth clock signal is input; and a built-in self test circuit having: a first signal generating circuit to which the first clock signal is input and which operates in accordance with the first clock signal and generates and outputs a signal for testing the first memory, a second signal generating circuit to which the second clock signal is input and which operates in accordance with the second clock signal and generates and outputs a signal for testing the first memory, a third signal generating circuit to which the third clock signal is input and which operates in accordance with the third clock signal and generates and outputs a signal for testing the second memory, a fourth signal generating circuit to which the fourth clock signal is input and which operates in accordance with the fourth clock signal and generates and outputs a signal for testing the second memory, a first clock selecting circuit to which the first and second clock signals are input and which selects and outputs one of the input clock signals, a second clock selecting circuit to which the third and fourth clock signals are input and which selects and outputs one of the input clock signals, a selecting circuit to which the clock signal selected and output by the first clock selecting circuit and the clock signal selected and output by the second clock selecting circuit are input and which selects and outputs one of the input clock signals, and a controlling circuit which outputs a clock requesting signal requesting one of the first and second clock signals to the first clock selecting circuit, outputs a clock requesting signal requesting one of the third and fourth clock signals to the second clock selecting circuit, operates in accordance with the clock signal selected and output by the selecting circuit, and outputs a controlling signal for controlling one of the first, second, third, and fourth signal generating circuits.

Another embodiment of the present invention is, for example, an integrated circuit device including: a plurality of memories, to each of which a plurality of clock signals are input; a plurality of signal generating circuits, each of which corresponds to one of the clock signals for one of the memories, to each of which the corresponding clock signal for the corresponding memory is input, and each of which operates in accordance with the input clock signal and generates and outputs a signal for testing the corresponding memory; a plurality of clock selecting circuits, each of which corresponds to one of the memories, to each of which the plurality of clock signals for the corresponding memory are input, and each of which selects and outputs one of the input clock signals; a selecting circuit to which the plurality of clock signals selected and output by the plurality of clock selecting circuits are input and which selects and outputs one of the input clock signals; and a controlling circuit which outputs a clock requesting signal requesting a certain one of the clock signals for a certain one of the memories to the clock selecting circuit corresponding to the certain memory, operates in accordance with the certain clock signal selected and output by the selecting circuit, and outputs a controlling signal for controlling the signal generating circuit corresponding to the certain clock signal.

DESCRIPTION OF THE EMBODIMENTS

First Embodiment

Figure 1:
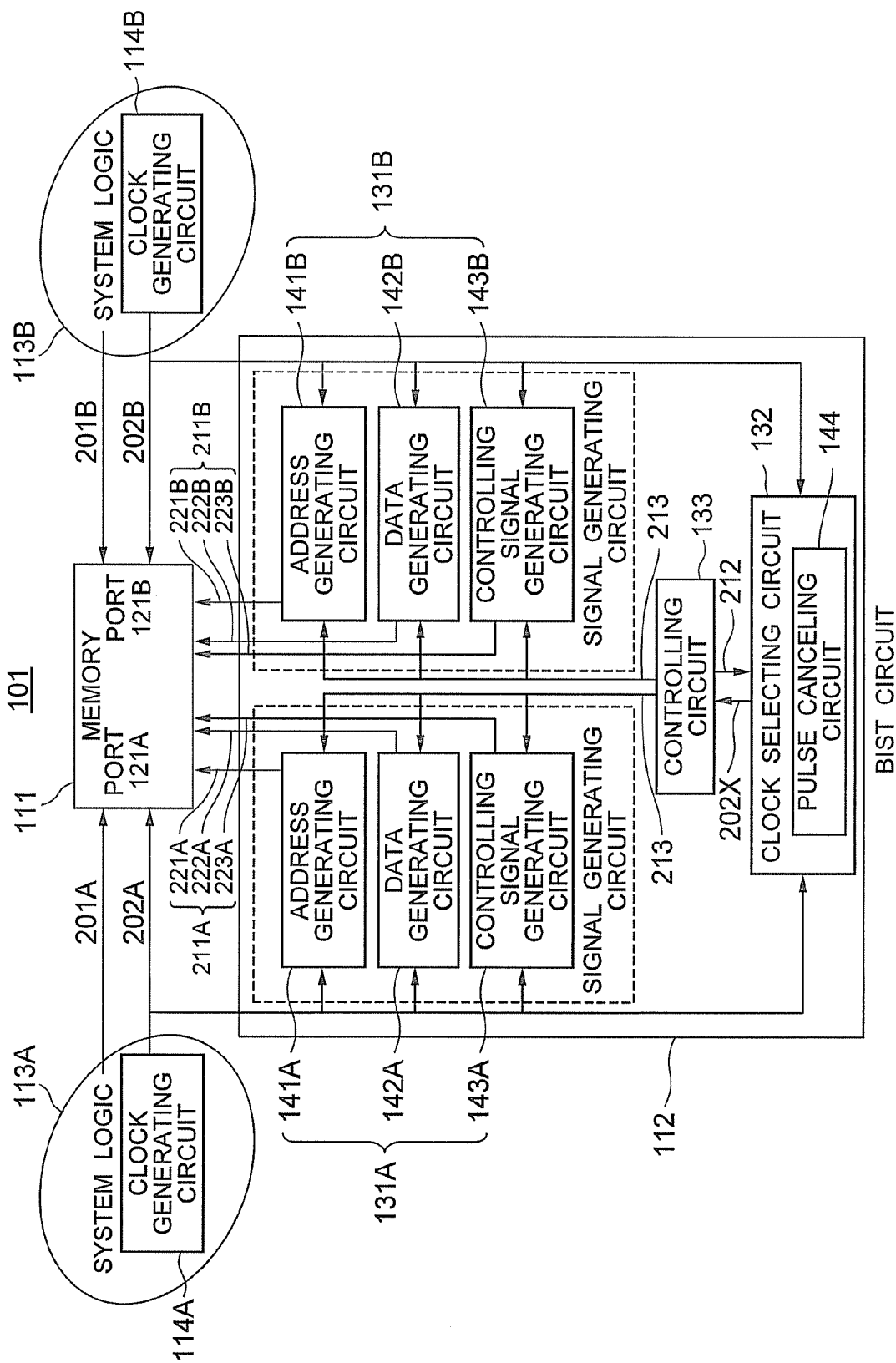
FIG. 1 is a circuit configuration diagram of an integrated circuit device according to a first embodiment.

FIG. 1 is a circuit configuration diagram of an integrated circuit device 101 according to a first embodiment. The integrated circuit device 101 includes one memory 111, one BIST circuit 112, and system logics 113A and 113B, all of which are provided on a common IC substrate.

The memory 111 is a multi-port memory having a plurality of ports. The memory 111 has two ports 121A and 121B in this embodiment. The port 121A is a port for writing. A system signal for writing (201A) is input from the system logic 113A to the port 121A. The port 121B is a port for reading. A system signal for reading (201B) is output from the port 121B to the system logic 113B. Furthermore, a clock signal for writing (202A) is input from a clock generating circuit 114A of the system logic 113A to the port 121A. Furthermore, a clock signal for reading (202B) is input from a clock generating circuit 114B of the system logic 113B to the port 121B. The clock signals 202A and 202B in this embodiment are clock signals which are generated by the different clock generating circuits 114A and 114B and have frequencies independent of each other.

Figure 2A:
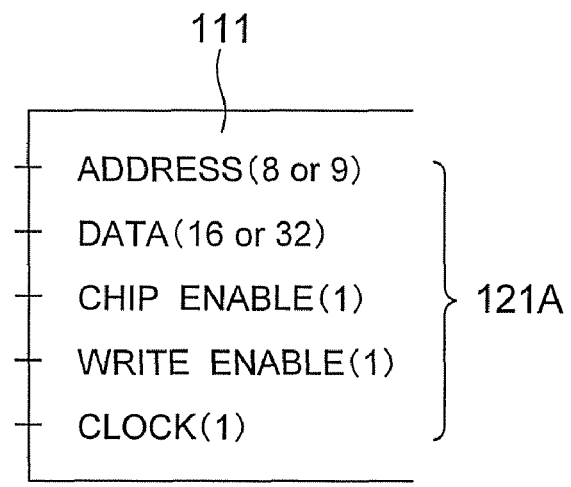
FIG. 2A is a chart for explaining a specific example of the pin configuration of a port for writing.
Figure 2B:
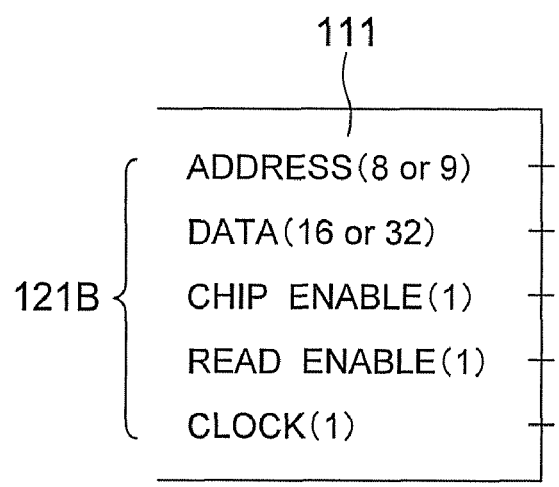
FIG. 2B is a chart for explaining a specific example of the pin configuration of a port for reading.

FIGS. 2A and 2B show specific examples of the pin configurations of the ports 121A and 121B, respectively. Each of the ports 121A and 121B in this embodiment includes a plurality of address pins, a plurality of data pins, a chip enable pin, a write enable pin or read enable pin, and a clock pin.

The BIST circuit 112 is an integrated circuit for testing the memory 111. The BIST circuit 112 has two signal generating circuits 131A and 131B, one clock selecting circuit 132, and one controlling circuit 133 in this embodiment. The signal generating circuits 131A and 131B have address generating circuits 141A and 141B, data generating circuits 142A and 142B, and controlling signal generating circuits 143A and 143B, respectively. The clock selecting circuit 132 has a pulse canceling circuit 144.

The clock signals 202A and 202B are respectively input to the signal generating circuits 131A and 131B. The signal generating circuits 131A and 131B respectively operate in accordance with the clock signals 202A and 202B, and generate and output BIST signals 211A and 211B for testing the memory 111. The BIST signals 211A and 211B in this embodiment include signals 221A and 221B which are generated and output by the address generating circuits 141A and 141B, data signals 222A and 222B which are generated and output by the data generating circuits 142A and 142B, and controlling signals 223A and 223B for the memory 111 which are generated and output by the controlling signal generating circuits 143A and 143B, respectively. The BIST signals 211A and 211B generated and output by the signal generating circuits 131A and 131B are input to the memory 111.

The clock signals 202A and 202B are input to the clock selecting circuit 132. The clock selecting circuit 132 selects and outputs one of the input clock signals (the clock signal 202A or clock signal 202B in this embodiment). A clock signal 202X which is selected and output by the clock selecting circuit 132 is input to the controlling circuit 133.

The controlling circuit 133 is a type of finite state machine (FSM). The controlling circuit 133 in this embodiment has a write mode in which the controlling circuit 133 operates in accordance with the clock signal for writing (202A), and a read mode in which the controlling circuit 133 operates in accordance with the clock signal for reading (202B).

The controlling circuit 133 outputs a clock requesting signal 212 requesting the clock signal for writing (202A) to the clock selecting circuit 132, when it transits from the read mode to the write mode. In response to this, the clock selecting circuit 132 selects and outputs the clock signal 202A. The controlling circuit 133 in the write mode operates in accordance with the clock signal 202X (i.e., the clock signal 202A) selected and output by the clock selecting circuit 132, and outputs a controlling signal 213 for controlling the signal generating circuit 131A. In response to this, the signal generating circuit 131A generates and outputs the BIST signal 211A for testing the memory 111.

The controlling circuit 133 outputs a clock requesting signal 212 requesting the clock signal for reading (202B) to the clock selecting circuit 132, when it transits from the write mode to the read mode. In response to this, the clock selecting circuit 132 selects and outputs the clock signal 202B. The controlling circuit 133 in the read mode operates in accordance with the clock signal 202X (i.e., the clock signal 202B) selected and output by the clock selecting circuit 132, and outputs a controlling signal 213 for controlling the signal generating circuit 131B. In response to this, the signal generating circuit 131B generates and outputs the BIST signal 211B for testing the memory 111.

Figure 3:
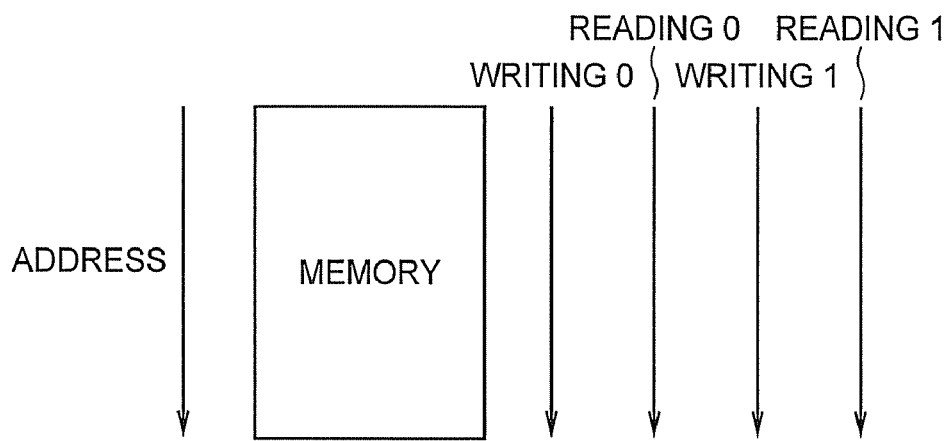
FIG. 3 is a chart for explaining a specific example of a simple test algorithm.
Figure 4:
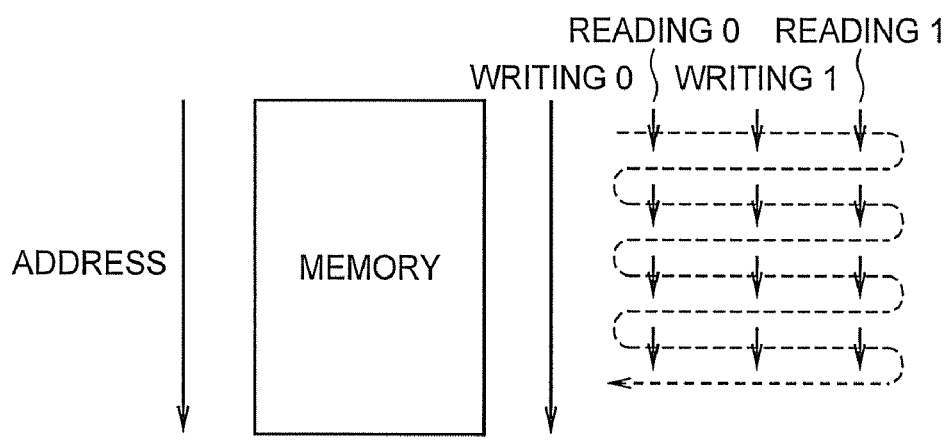
FIG. 4 is a chart for explaining a specific example of a complicated test algorithm.
Figure 5:
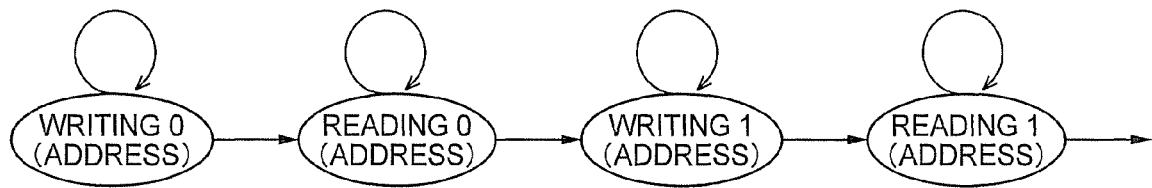
FIG. 5 is a state transition diagram corresponding to FIG. 3.
Figure 6:
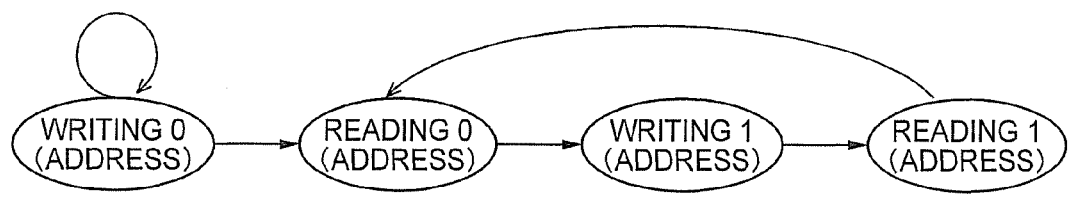
FIG. 6 is a state transition diagram corresponding to FIG. 4.

FIGS. 3 and 4 show specific examples of a simple test algorithm and a complicated test algorithm, respectively. In FIG. 3, "0" is written into all addresses of a memory, and then "0" is read from all the addresses of the memory. Subsequently, "1" is written into all the addresses of the memory, and then "1" is read from all the addresses of the memory. FIG. 5 shows a state transition diagram corresponding to FIG. 3. On the other hand, in FIG. 4, after "0" is written into all addresses of a memory, a combination of reading of "0," writing of "1," and reading of "1" is performed for each address of the memory in order. FIG. 6 shows a state transition diagram corresponding to FIG. 4.

When the BIST circuit 112 tests the memory 111 in FIG. 1, the BIST circuit 112 needs to operate, in writing, in accordance with the clock signal for writing (202A), and to operate, in reading, in accordance with the clock signal for reading (202B). For this reason, the frequency of switching clock signals matters in a test on the memory 111 using the BIST circuit 112. Clock signal switching need not be frequently performed if the simple test algorithm as shown in FIG. 3 is adopted, while clock signal switching needs to be frequently performed if the complicated test algorithm as shown in FIG. 4 is adopted.

In the BIST circuit 112 in FIG. 1, the progression of a test algorithm is controlled by the controlling circuit 133, which is a finite state machine. If the test algorithm in FIG. 3 is adopted, the state of the controlling circuit 133 transits as in the state transition diagram in FIG. 5. If the test algorithm in FIG. 4 is adopted, the state of the controlling circuit 133 transits as in the state transition diagram in FIG. 6. Clock signal switching is performed by output of the clock requesting signal 212 from the controlling circuit 133 to the clock selecting circuit 132; the output is an action accompanying a transition of the state of the controlling circuit 133. The presence of the controlling circuit 133 allows the BIST circuit 112 to perform frequent clock signal switching. Specific examples of a test algorithm which can be controlled by the controlling circuit 133 include a March test algorithm.

Figure 7:
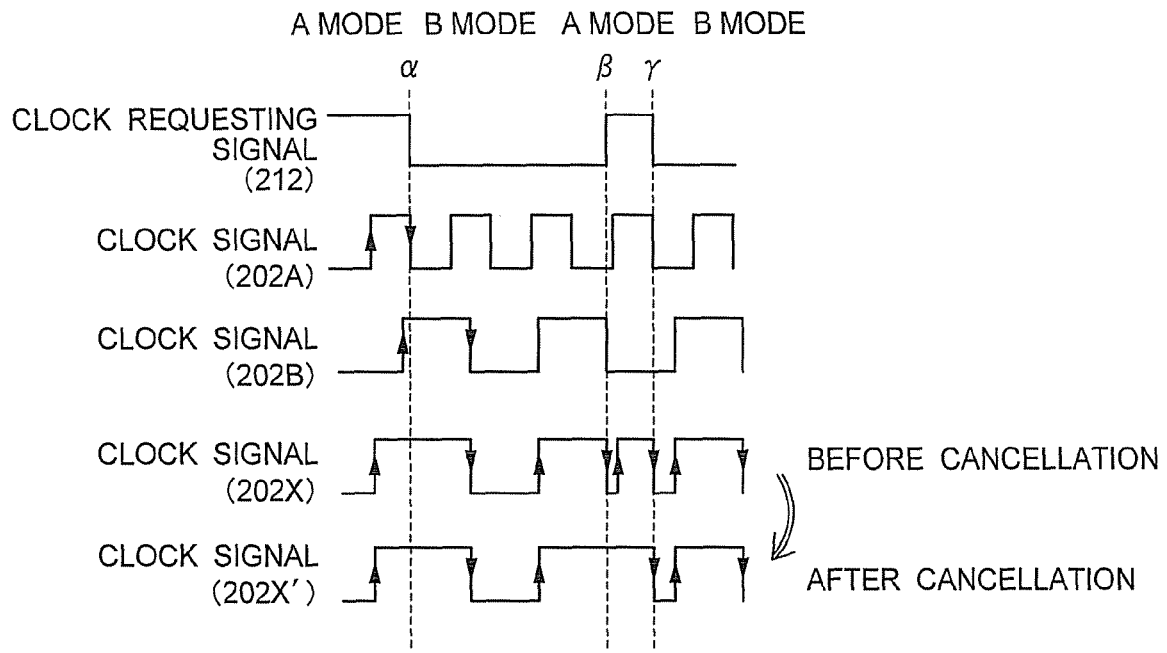
FIG. 7 is a chart showing the waveforms of a clock requesting signal and clock signals.

FIG. 7 is a chart showing a waveform of the clock requesting signal 212. In this embodiment, the clock requesting signal 212 at a positive (high) level is a signal requesting the clock signal 202A, and the clock requesting signal 212 at a negative (low) level is a signal requesting the clock signal 202B. When the clock requesting signal 212 switches from positive to negative, the clock signal requested by the clock requesting signal 212 switches from the clock signal 202A to the clock signal 202B. On the other hand, when the clock requesting signal 212 switches from negative to positive, the clock signal requested by the clock requesting signal 212 switches from the clock signal 202B to the clock signal 202A.

As shown in FIG. 7, in order to ensure the minimum clock pulse width, the controlling circuit 133 uses a falling edge of the current clock signal 202X as a trigger for performing clock signal switching. The controlling circuit 133 switches, triggered by a falling edge of the current clock signal 202X, clock signals requested using the clock requesting signal 212. In FIG. 7, clock signal switching is performed at time α, time β, and time γ, triggered by falling edges of the clock signal 202A, the clock signal 202B, and the clock signal 202A, respectively.

Figure 8:
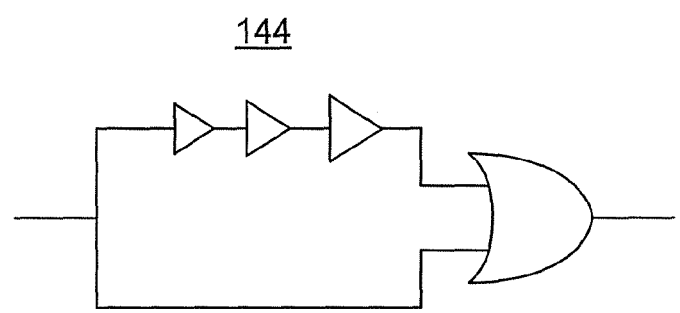
FIG. 8 shows a specific example of a circuit configuration diagram of a pulse canceling circuit.

In this case, as the clock signal 202X immediately after time β in FIG. 7, the clock signal 202X immediately after switching may have a negative (low) pulse with a short pulse width. To prevent this, the pulse canceling circuit 144 for canceling a negative pulse whose pulse width is smaller than (or not greater than) a threshold, is provided in the clock selecting circuit 132. With this configuration, the clock signal 202X becomes like a clock signal 202X', and a negative pulse whose pulse width is smaller than (or not greater than) the minimum pulse width is canceled. FIG. 8 shows a specific example of a circuit configuration diagram of the pulse canceling circuit 144.

The controlling circuit 133 may switch, triggered by a rising edge of the current clock signal 202X, clock signals requested using the clock requesting signal 212. In this case, the pulse canceling circuit 144 for canceling a positive pulse whose pulse width is smaller than (or not greater than) a threshold, is provided in the clock selecting circuit 132.

The above-described configuration and processing allow the integrated circuit device 101 in FIG. 1 to perform a test by the BIST circuit 112 for the memory 111 having a plurality of clocks independent of each other, without making changes to a system clock. This embodiment is also applicable to a test in which writing and reading for the same address are alternately performed for each address, and clock signal switching is required with each writing or reading operation, such as a test using a March algorithm. This embodiment is applicable to, for example, a comparator-type BIST or compactor-type BIST. In the former case, a comparator and a comparison result analyzer are provided in the integrated circuit device 101 in FIG. 1. In the latter case, a compactor and a compaction result analyzer are provided in the integrated circuit device 101 in FIG. 1. An example which can be used as the compactor is a multiple input signature register (MISR) as described in "Built-In Test for VLSI: Pseudo Random Techniques, Paul. H. Bardell, William H. McAnney and Jacob Savir, John Wiley & Sons, 1987" a multiple input signature register (MISR) is a variant of a linear feedback shift register.

This embodiment is applicable not only to a multi-port memory having two ports, but also to a multi-port memory having three or more ports. If the memory 111 has N ports 121, and N types of system signals 201 and N types of clock signals 202 are input to the memory 111 (N is an integer greater than 1), N signal generating circuits 131, one clock selecting circuit 132, and one controlling circuit 133 are provided in the BIST circuit 112.

In this case, the first, second, . . . , and Nth clock signals 202 are respectively input to the first, second, . . . , and Nth signal generating circuits 131, which operate in accordance with the first, second, . . . , and Nth clock signals 202 and generate and output first, second, . . . , and Nth BIST signals 211 for testing the memory 111. Further, the first, second, . . . , and Nth clock signals 202 are input to the clock selecting circuit 132, which selects and outputs one of the first, second, . . . , and Nth signals 202. Further, the controlling circuit 133 outputs the clock requesting signal 212 requesting one of the first, second, . . . , and Nth clock signals 202 to the clock selecting circuit 132, operates in accordance with the clock signal 202 selected and output by the clock selecting circuit 132, and outputs the controlling signal 213 for controlling one of the first, second, . . . , and Nth signal generating circuits 131.

This embodiment is applicable not only to an integrated circuit device in which a BIST circuit tests a multi-port memory, but also to an integrated circuit device in which a BIST circuit tests two or more (e.g., about several tens to several hundreds) multi-port memories. Such an embodiment will be described as a second embodiment.

Second Embodiment

Figure 9:
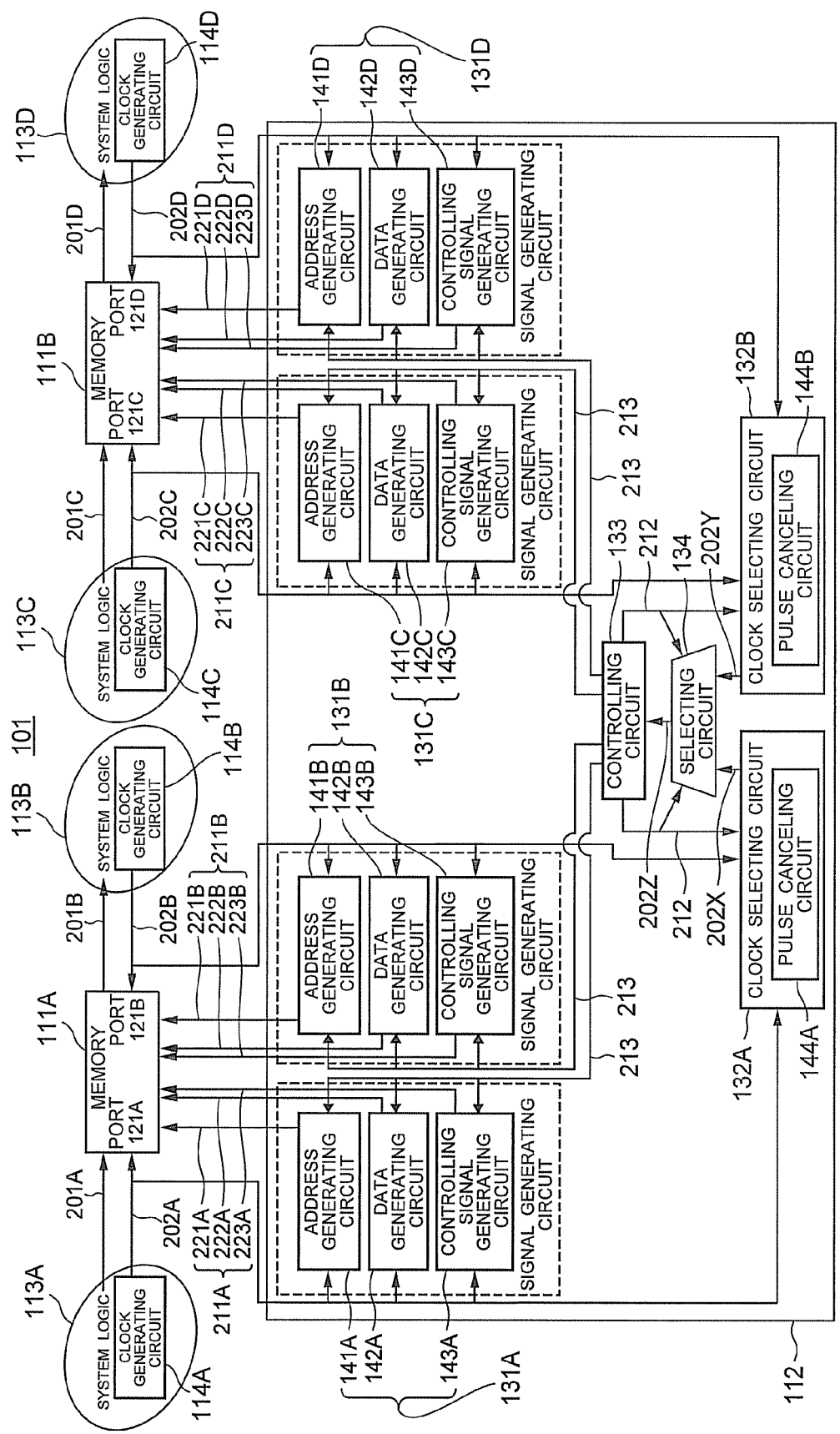
FIG. 9 is a circuit configuration diagram of an integrated circuit device according to a second embodiment.

FIG. 9 is a circuit configuration diagram of an integrated circuit device 101 according to a second embodiment. The integrated circuit device 101 includes two memories 111A and 111B, one BIST circuit 112, and system logics 113A, 113B, 113C, and 113D, all of which are provided on a common IC substrate.

The memory 111A is a multi-port memory having a plurality of ports. The memory 111A has two ports 121A and 121B in this embodiment. Similarly, the memory 111B is a multi-port memory having a plurality of ports. The memory 111B has two ports 121C and 121D in this embodiment. The ports 121A and 121C are ports for writing. System signals for writing (201A and 201C) are respectively input from the system logics 113A and 113C to the ports 121A and 121C. The ports 121B and 121D are ports for reading. System signals for reading (201B and 201D) are respectively output from the ports 121B and 121D to the system logics 113B and 113D. Furthermore, clock signals for writing (202A and 202C) are respectively input from clock generating circuits 114A and 114C of the system logics 113A and 113C to the ports 121A and 121C. Furthermore, clock signals for reading (202B and 202D) are respectively input from clock generating circuits 114B and 114D of the system logics 113B and 113D to the ports 121B and 121D. The clock signals 202A and 202B in this embodiment are clock signals which are generated by the different clock generating circuits 114A and 114B and have frequencies independent of each other. The clock signals 202C and 202D in this embodiment are also clock signals which are generated by the different clock generating circuits 114C and 114D and have frequencies independent of each other.

The BIST circuit 112 is an integrated circuit for testing the memories 111A and 111B. The BIST circuit 112 has four signal generating circuits 131A, 131B, 131C, and 131D, two clock selecting circuits 132A and 132B, one controlling circuit 133, and one selecting circuit 134 in this embodiment. The signal generating circuits 131A, 131B, 131C, and 131D have address generating circuits 141A, 141B, 141C, and 141D, data generating circuits 142A, 142B, 142C, and 142D, and controlling signal generating circuits 143A, 143B, 143C, and 143D, respectively. The clock selecting circuits 132A and 132B have pulse canceling circuits 144A and 144B, respectively.

The clock signals 202A, 202B, 202C, and 202D are respectively input to the signal generating circuits 131A, 131B, 131C, and 131D. The signal generating circuits 131A and 131B respectively operate in accordance with the clock signals 202A and 202B, and generate and output BIST signals 211A and 211B for testing the memory 111A. The signal generating circuits 131C and 131D respectively operate in accordance with the clock signals 202C and 202D, and generate and output BIST signals 211C and 211D for testing the memory 111B. The BIST signals 211A, 211B, 211C, and 211D include address signals 221A, 221B, 221C, and 221D which are generated and output by the address generating circuits 141A, 141B, 141C, and 141D, data signals 222A, 222B, 222C, and 222D which are generated and output by the data generating circuits 142A, 142B, 142C, and 142D, and controlling signals 223A, 223B, 223C, and 223D for the memory 111A or 111B which are generated and output by the controlling signal generating circuits 143A, 143B, 143C, and 143D, respectively. The BIST signals 211A and 211B generated and output by the signal generating circuits 131A and 131B are input to the memory 111A. The BIST signals 211C and 211D generated and output by the signal generating circuits 131C and 131D are input to the memory 111B.

The clock signals 202A and 202B are input to the clock selecting circuit 132A. The clock signals 202C and 202D are input to the clock selecting circuit 132B. The clock selecting circuit 132A selects and outputs one of the input clock signals (the clock signal 202A or clock signal 202B in this embodiment). Similarly, the clock selecting circuit 132B selects and outputs one of the input clock signals (the clock signal 202C or clock signal 202D in this embodiment). Clock signals 202X and 202Y which are selected and output by the clock selecting circuits 132A and 132B are input to the selecting circuit 134.

The clock signal 202X selected and output by the clock selecting circuit 132A and the clock signal 202Y selected and output by the clock selecting circuit 132B are input to the selecting circuit 134. The selecting circuit 134 selects and outputs one of the input clock signals (the clock signal 202X or clock signal 202Y in this embodiment). A clock signal 202Z selected and output by the selecting circuit 134 is input to the controlling circuit 133.

The clock signal 202Z selected and output by the selecting circuit 134 is a clock signal corresponding to a memory which is to be tested at the time. For example, the clock signal 202X is selected and output at the time of a test on the memory 111A. On the other hand, the clock signal 202Y is selected and output at the time of a test on the memory 111B. Switching of memories to be tested may be controlled by the BIST circuit 112 or a CPU. In the latter case, information on a memory to be tested is supplied from the CPU to the selecting circuit 134.

The controlling circuit 133 is a type of finite state machine (FSM). The controlling circuit 133 in this embodiment has a write mode in which the controlling circuit 133 operates in accordance with one of the clock signals for writing (202A or 202C), and a read mode in which the controlling circuit 133 operates in accordance with one of the clock signals for reading (202B or 202D).

The controlling circuit 133 outputs a clock requesting signal 212 requesting the clock signal for writing (202A) to the clock selecting circuit 132A and the selecting circuit 134, and outputs a clock requesting signal 212 requesting the clock signal for writing (202C) to the clock selecting circuit 132B and the selecting circuit 134, when it transits from the read mode to the write mode. In response to these, the clock selecting circuit 132A selects and outputs the clock signal 202A, and the clock selecting circuit 132B selects and outputs the clock signal 202C. Then, the selecting circuit 134 selects and outputs the clock signal 202X (i.e., the clock signal 202A) at the time of the test on the memory 111A and the clock signal 202Y (i.e., the clock signal 202C) at the time of the test on the memory 111B. The controlling circuit 133 in the write mode operates in accordance with the clock signal 202Z (i.e., the clock signal 202A or 202C) selected and output by the selecting circuit 134, and outputs a controlling signal 213 for controlling the signal generating circuit 131A or 131C. In response to this, the signal generating circuit 131A or 131C generates and outputs the BIST signal 211A or 211C for testing the memory 111A or 111B.

The controlling circuit 133 outputs a clock requesting signal 212 requesting the clock signal for reading (202B) to the clock selecting circuit 132A and the selecting circuit 134, and outputs a clock requesting signal 212 requesting the clock signal for reading (202D) to the clock selecting circuit 132B and the selecting circuit 134, when it transits from the write mode to the read mode. In response to these, the clock selecting circuit 132A selects and outputs the clock signal 202B, and the clock selecting circuit 132B selects and outputs the clock signal 202D. Then, the selecting circuit 134 selects and outputs the clock signal 202X (i.e., the clock signal 202B) at the time of the test on the memory 111A and the clock signal 202Y (i.e., the clock signal 202D) at the time of the test on the memory 111B. The controlling circuit 133 in the read mode operates in accordance with the clock signal 202Z (i.e., the clock signal 202B or 202D) selected and output by the selecting circuit 134, and outputs a controlling signal 213 for controlling the signal generating circuit 131B or 131D. In response to this, the signal generating circuit 131B or 131D generates and outputs the BIST signal 211B or 211D for testing the memory 111A or 111B.

This embodiment is applicable not only to an integrated circuit device in which a BIST circuit tests two multi-port memories, but also to an integrated circuit device in which a BIST circuit tests three or more multi-port memories. If each of first, second, and Kth memories 111 has N ports 121, and N types of system signals 201 and N types of clock signals 202 are input to each of the first, second, . . . , and Kth memories 111 (each of K and N is a integer greater 1), K*N signal generating circuits 131, K clock selecting circuits 132, one controlling circuit 133, and one selecting circuit 134 are provided in the BIST circuit 112. The manner in which the signal generating circuits 131, clock selecting circuits 132, controlling circuit 133, and selecting circuit 134 operate is the same as that described above. The number of ports 121 of each of the first, second, . . . , and Kth memories 111 may or may not be standardized.

A supplementary explanation of the K*N signal generating circuits 131, K clock selecting circuits 132, one controlling circuit 133, and one selecting circuit 134 will be given.

Each of the K*N signal generating circuits 131 corresponds to one of the clock signals 202 for one of the memories 111, as in FIG. 9. The corresponding clock signal 202 for the corresponding memory 111 is input to each of the K*N signal generating circuits 131. Each of the K*N signal generating circuits 131 operates in accordance with the input clock signal 202, and generates and outputs a BIST signal 211 for testing the corresponding memory 111. This is the same as in the case of FIG. 9.

Each of the K clock selecting circuits 132 corresponds to one of the memories 111, as in FIG. 9. The N types of clock signals 202 for the corresponding memory 111 are input to each of the K clock selecting circuits 132. Each of the K clock selecting circuits 132 selects and outputs one of the input clock signals 202. This is the same as in the case of FIG. 9.

The K types of clock signals 202 selected and output by the K clock selecting circuits 132 are input to the selecting circuit 134. The selecting circuit 134 selects and outputs one of the input clock signals 202. This is the same as in the case of FIG. 9.

The controlling circuit 133 outputs a clock requesting signal 212 requesting a certain one of the clock signals 202 for a certain one of the memories 111, to the clock selecting circuit 132 corresponding to the certain memory 111. The clock requesting signal 212 is output to the clock selecting circuit 132 and the selecting circuit 134. Then, the controlling circuit 133 operates in accordance with the certain clock signal 202 selected and output by the selecting circuit 134. Then, the controlling circuit 133 outputs a controlling signal 213 for controlling the signal generating circuit 131 corresponding to the certain clock signal 202. This is the same as in the case of FIG. 9.

As described above, according to this embodiment, it is possible to test two or more memories 111, using one BIST circuit 112 with a simple configuration. To test a plurality of memories 111 using one BIST circuit 112, this embodiment requires a plurality of signal generating circuits 131 and a plurality of clock selecting circuits 132 but requires only one controlling circuit 133. For this reason, according to this embodiment, it is possible to realize an integrated circuit device 101 capable of testing a plurality of memories 111 using one BIST circuit 112 while minimizing the complexity in the BIST circuit 112. Furthermore, since memories which share a clock signal source can share a signal generating circuit 131 and a clock selecting circuit 132, an increase in the complexity in the BIST circuit 112 can be further suppressed by having a part or all of the memories 111 share a clock signal source. Such memories as share a signal generating circuit 131 and a clock selecting circuit 132 have an advantage that they can be tested simultaneously by the integrated circuit device 101.

According to the embodiments of the present invention, an integrated circuit device including a built-in self test circuit suitable for testing a multi-port memory is realized.

The invention claimed is:

1. An integrated circuit device comprising:
   a memory having:
   a first port to input a first clock signal, and
   a second port to input a second clock signal; and a built-in self test circuit having:
   a first signal generating circuit to input the first clock signal and which operates in accordance with the first clock signal and generates and outputs a signal for testing the memory,
   a second signal generating circuit to input the second clock signal and which operates in accordance with the second clock signal and generates and outputs a signal for testing the memory,
   a clock selecting circuit to input the first and second clock signals and which selects and outputs one of the input clock signals, and
   a controlling circuit, which outputs a clock requesting signal requesting one of the first and second clock signals to the clock selecting circuit, operates in accordance with the clock signal selected and output by the clock selecting circuit, and outputs a controlling signal for controlling one of the first and second signal generating circuits.

2. The device according to claim 1, wherein the first and second clock signals are clock signals whose frequencies are independent of each other.

3. The device according to claim 1, wherein the first and second clock signals are generated by first and second clock generating circuits, respectively.

4. The device according to claim 1, wherein the first port is a port for writing, to input the first clock signal serving as a clock signal for writing, and
   the second port is a port for reading, to input the second clock signal serving as a clock signal for reading.

5. The device according to claim 4, wherein
   a system signal for writing is inputted to the first port, and
   a system signal for reading is outputted from the second port.

6. The device according to claim 1, wherein the control circuit is a finite state machine (FSM).

7. The device according to claim 1, wherein the control circuit has a write mode in which the control circuit operates in accordance with the first clock signal serving as a clock signal for writing, and a read mode in which the control circuit operates in accordance with the second clock signal serving as a clock signal for reading.

8. The device according to claim 7, wherein the control circuit outputs the clock requesting signal which requests the first clock signal, when the control circuit transits from the read mode to the write mode.

9. The device according to claim 7, wherein the control circuit outputs the clock which requests signal requesting the second clock signal, when the control circuit transits from the write mode to the read mode.

10. The device according to claim 7, wherein the control circuit in the write mode outputs the control signal which for controls the first signal generating circuit, and the first signal generating circuit generates and outputs the signal in response to the control signal.

11. The device according to claim 7, wherein the control circuit in the read mode outputs the control signal which controls the second signal generating circuit, and the second signal generating circuit generates and outputs the signal in response to the control signal.

12. The device according to claim 1, wherein the control circuit switches clock signals requested using the clock requesting signal, triggered by a rising edge or a falling edge of a current clock signal.

13. The device according to claim 1, wherein the clock selecting circuit comprises a pulse canceling circuit which cancels a pulse whose pulse width is smaller than or not greater than a threshold.

14. The device according to claim 1, wherein each of the first and second signal generating circuits has an address generating circuit which generates and outputs an address signal, a data generating circuit which generates and outputs a data signal, and a control signal generating circuit which generates and outputs a control signal for the memory.

15. An integrated circuit device comprising first and second memories with a built-in self test circuit, wherein
the first memory comprises:
a first port configured to input a first clock signal, and
a second port configured to input a second clock signal;
the second memory comprises:
a third port configured to input a third clock signal, and
a fourth port configured to input a fourth clock signal; and
the built-in self test circuit comprises:
a first signal generating circuit configured to input the first clock signal, and to operate in accordance with the first clock signal and generate and output a signal for testing the first memory,
a second signal generating circuit configured to input the second clock signal, and to operate in accordance with the second clock signal and generate and output a signal for testing the first memory,
a third signal generating circuit configured to input the third clock signal, and to operate in accordance with the third clock signal and generate and output a signal for testing the second memory,
a fourth signal generating circuit configured to input the fourth clock signal, and to operate in accordance with the fourth clock signal and generate and output a signal for testing the second memory,
a first clock selecting circuit configured to input the first and second clock signals, and to select and output one of the inputted clock signals,
a second clock selecting circuit configured to input the third and fourth clock signals, and to select and output one of the inputted clock signals,
a selecting circuit configured to input the clock signal selected and outputted by the first clock selecting circuit and the clock signal selected and outputted by the second clock selecting circuit, and to select and output one of the inputted clock signals, and
a controlling circuit configured to be shared with the first to fourth signal generating circuits, and to output a clock requesting signal which requests one of the first and second clock signals to the first clock selecting circuit, output a clock requesting signal which requests one of the third and fourth clock signals to the second clock selecting circuit, and operate in accordance with the clock signal selected and outputted by the selecting circuit, the control circuit outputting a control signal which controls the first signal generating circuit if the clock signal from the selecting circuit is the first clock signal, the control circuit outputting a control signal which controls the second signal generating circuit if the clock signal from the selecting circuit is the second clock signal, the control circuit outputting a control signal which controls the third signal generating circuit if the clock signal from the selecting circuit is the third clock signal, and the control circuit outputting a control signal which controls the fourth signal generating circuit if the clock signal from the selecting circuit is the fourth clock signal.

16. The device according to claim 15, wherein
the first port is a port for writing, to input the first clock signal serving as a clock signal for writing,
the second port is a port for reading, to input the second clock signal serving as a clock signal for reading,
the third port is a port for writing, to input the third clock signal serving as a clock signal for writing, and
the fourth port is a port for reading, to input the fourth clock signal serving as a clock signal for reading.

17. The device according to claim 16, wherein
a system signal for writing is inputted to the first port,
a system signal for reading is outputted from the second port,
a system signal for writing is inputted to the third port, and
a system signal for reading is outputted from the fourth port.

18. The device according to claim 15, wherein the control circuit has a write mode in which the control circuit operates in accordance with one of the first and third clock signals serving as a clock signal for writing, and a read mode in which the control circuit operates in accordance with one of the second and fourth clock signals serving as a clock signal for reading.

19. The device according to claim 15, wherein the selecting circuit selects and outputs a clock signal corresponding to a memory which is to be tested.

20. An integrated circuit device comprising:
a plurality of memories, each configured to input a plurality of clock signals;
a plurality of signal generating circuits, configured to operate in accordance with one of the clock signals inputted in one of the memories, and generate and output a signal for testing the one of the memories;
a plurality of clock selecting circuits, configured to select and output one of the clock signals inputted in one of the memories;
a selecting circuit configured to input the clock signals selected and outputted by the clock selecting circuits, and to select and output one of the inputted clock signals; and
a control circuit configured to share with the signal generating circuits, and to output a clock requesting signal which requests one of the clock signals for one of the memories to one of the clock selecting circuits corresponding to the one of the memories, and operate in accordance with the requested clock signal if the requested clock signal is selected and outputted by the selecting circuit, the control circuit outputting a control signal which controls one of the signal generating circuits corresponding to the requested clock signal.

* * * * *